United States Patent [19]

Nakagawa et al.

[11] 4,219,732
[45] Aug. 26, 1980

[54] MAGNETIC ELECTRON LENS

[75] Inventors: Seiichi Nakagawa; Akira Yonezawa; Masatsugu Kikuchi, all of Tokyo, Japan

[73] Assignee: Nihon Denshi Kabushiki Kaisha, Tokyo, Japan

[21] Appl. No.: 24,692

[22] Filed: Mar. 28, 1979

[30] Foreign Application Priority Data

Apr. 7, 1978 [JP] Japan .................................. 53-41082

[51] Int. Cl.² .......................................... G01N 23/00
[52] U.S. Cl. .............................. 250/396 ML; 250/311
[58] Field of Search ........... 250/396 R, 396 ML, 310, 250/311; 335/209; 313/361

[56] References Cited

U.S. PATENT DOCUMENTS

| 2,714,678 | 8/1955 | Wolff | 250/396 ML |
| 2,859,363 | 11/1958 | Leisegang et al. | 250/396 ML |
| 3,100,260 | 8/1963 | Wilska | 250/396 ML |
| 3,717,761 | 2/1973 | Koike et al. | 250/396 ML |

Primary Examiner—Bruce C. Anderson
Attorney, Agent, or Firm—Webb, Burden, Robinson & Webb

[57] ABSTRACT

In a scanning electron microscope, an objective lens field is generated between a pair of deflecting coils and a specimen by an objective lens having upper and lower magnetic pole pieces. A supplemental magnetic pole piece is installed between said upper and lower magnetic pole pieces so that the half width of the objective lens axial magnetic field distribution is increased and the principal plane of the objective lens is positioned near the lower pole piece. By so doing, the spherical aberration coefficient of the objective lens is reduced and a high resolution scanning image is obtained.

5 Claims, 13 Drawing Figures

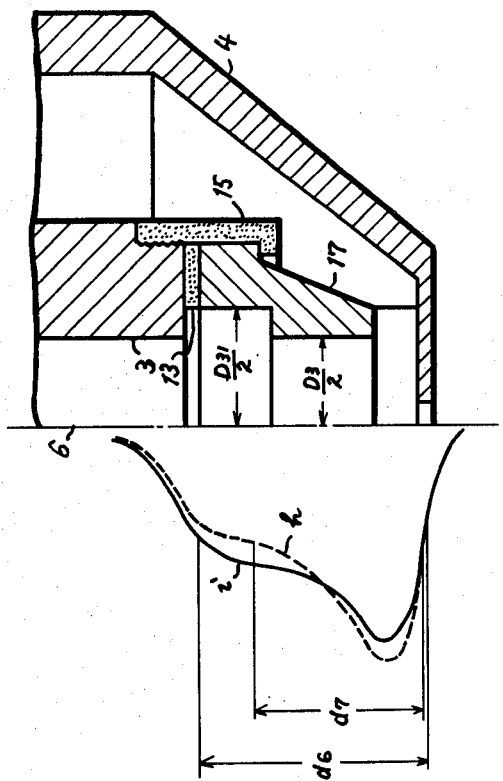
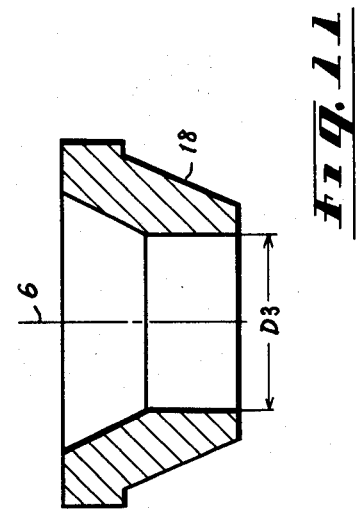
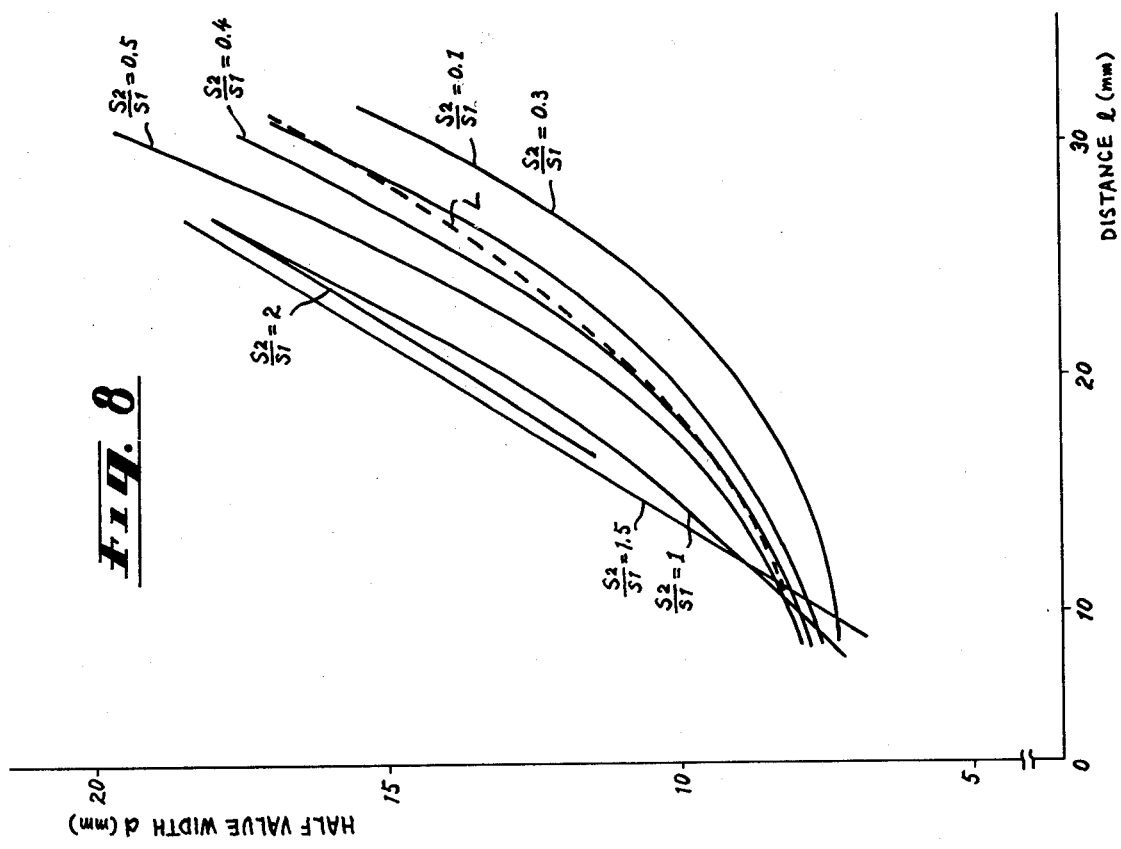

MAGNETIC ELECTRON LENS

BACKGROUND OF THE INVENTION

The subject invention relates to an improved magnetic electron lens for use in a scanning electron microscope and the like and, more particularly to an improved magnetic electron lens embodying a unique pole piece capable of reducing the spherical aberration coefficient of said lens to minimal proportions.

DESCRIPTION OF THE PRIOR ART

In a scanning electron microscope, electron probe X-ray microanalyzer and the like, a scanning image is displayed on a CRT by scanning the specimen with a finely focused electron beam. However, in order to ensure a high resolution scanning image, the diameter of the electron beam irradiating the specimen must be maximally reduced through the medium of the incorporated magnetic electron lens system. Theoretically, the beam diameter '$d_T$' of the electron beam irradiating the specimen is given as follows:

$$d_t^2 = d_G^2 + d_d^2 + d_c^2 + d_a^2 + d_s^2 \quad (1)$$

where, $d_G$ represents the diameter of the gauss image of the electron beam source determined by the brightness of the electron gun and the semi-angle $\alpha$ of the rays subtended by the electron lens system at the focused spot on the specimen, said gauss image being demagnified by said lens system, $d_d$ represents the diameter of the diffraction aberration image, said aberration being caused by the aperture of the objective lens (or the final stage of the condenser lens system), said diameter being determined by the accelerating voltage of the electron gun and the semiangle $\alpha$, $d_c$ represents the diameter of the chromatic aberration image determined by the semi-angle $\alpha$ and the fluctuation rate of the accelerating voltage and objective lens coil excitation current, $d_a$ represents the diameter of the image caused by on-axis astigmatism. Although, this astigmatism can be prevented by accurate machining of the objective lens pole pieces, it can be cancelled out with the stigmator installed in the conventional scanning electron microscope, $d_s$ represents the diameter of the spherical aberration image, said aberration being caused by the objective lens and said diameter being determined by the semi-angle $\alpha$ and the spherical aberration coefficient Cs of the objective lens as follows:

$$d_s^2 = (\tfrac{1}{2} Cs)^2 \cdot \alpha^6 \quad (2)$$

In view of the variability of such instrument related parameters as electron gun brightness, electron beam current, accelerating voltage, semi-angle $\alpha$, etc., it will be realized that '$d_s^2$' usually has a larger value than the other terms in equation (1). Accordingly, in order to reduce the diameter of the electron beam and thereby increase the resolution of the image, it is necessary to provide an objective lens having a smaller spherical aberration coefficient than conventional objective lenses.

FIG. 1 shows a cross-section of an objective lens pole piece assembly widely used in conventional scanning electron microscopes. In the figure, the lens yoke 1 houses an excitation coil 2. Upper 3 and lower 4 pole pieces form a magnetic field, symmetrical with respect to the lens axis 6, said pole pieces being integrated and provided with a thruhole through which an electron beam 5 passes. Deflection coils 7a and 7b scan the electron beam over a specimen 8. A detecting means 9 detects the secondary and backscattered electrons dislodged from said specimen 8 resultant upon electron beam irradiation, the output signal of said detecting means 9 being supplied to a CRT (not shown).

The broken line 10 indicates characteristic X-rays emanating from the specimen surface at a take-off angle $\beta$, the wavelength of said X-rays being analyzed by an X-ray spectrometer (not shown). $Z_o$ represents the distance between the principal plane of the objective lens and the specimen surface, said distance corresponding approximately with the focal length of the objective lens.

FIG. 2 is a graph which shows the spherical aberration coefficient Cs of the aforedescribed lens dependent upon the half (value) width 'd' of the axial magnetic field distribution formed between the upper and lower pole piece 3 and 4, and the value of parameter $Z_o$. It will thus be noted that by reducing $Z_o$, it is possible to reduce the spherical aberration. However, reducing $Z_o$ reduces the working distance (i.e., the distance between the lower surface of the lower pole piece 4 and the specimen surface), and reducing the working distance, restricts specimen movement (including tilt and rotation). It will be noted that the new specimen position 8' in FIG. 1 is extremely close to the lower pole piece 4. A further snag is that, as the working distance is reduced, the X-ray take-off angle decreases (compare $\beta$ and $\beta'$) with the result that when quantitatively analyzing elements, the correction method for obtaining calculated analytical data may be inadequate. If, on the other hand, the half value width of the lens magnetic field is increased as an alternative means of reducing spherical aberration, the fact that the size of the lower pole piece thru-hole will need to be increased must also be taken into consideration. However, if the size of the lower pole piece thru-hole is increased, the lens magnetic field passing through the thru-hole will be drawn downwards, a factor which has an adverse effect on ferromagnetic specimen and also on the electric field generated in the vicinity of the specimen by the electron detecting means in order to draw the secondary electrons from the specimen towards said detecting means. For this reason, the thru-hole in question must be kept as small as possible.

FIG. 3 shows the upper and lower lens pole pieces according to the prior art in which the pole piece gap 'S' is large and the pole piece thru-hole diameters $D_1$ and $D_2$ satisfy the equation $D_2 > 2 \cdot D_1$.

Further, FIG. 4 shows the magnetic field distribution along the lens axis 6 in the case of FIG. 3. In FIG. 4, 'a' represents the magnetic field distribution when the pole piece gap 'S" is comparatively small, and 'b' represents the magnetic field distribution when the pole piece gap 'S'''' is increased by positioning the upper pole piece as shown by the broken line. $d_1$ and $d_2$ are the half value widths of the respective field distributions. Thus, for a given magnetomotive force, increasing the distance between the upper and lower pole pieces, increases the half value width 'd' as shown in FIG. 5. However, as gap 'S' is increased, since the magnetic field is drawn (or extends) upwards towards the upper pole piece 3, as shown by the magnetic field distribution curve 'b' in FIG. 4, mutual interference occurs between the deflecting magnetic field generated by the deflector coil 7a and the objective lens magnetic field extended by increasing 'S'. As a result, scanning image distortion occurs which is especially large at low magnifications. Further, since the distribution curve 'b' is essentially bell-shaped, the principal plane of the objective lens shifts in the direction of the upper pole piece 3 regardless of field intensity. Concomitantly, $Z_o$ (which is about equal to the focal length 'f') and the chromatic aberration coefficient Cc increase, the increase of Cc being roughly proportional to the increase of 'f'. As a consequence thereof, the chromatic aberration image diameter $d_c$ in equation (1) increases, thereby causing an increase in the size of the electron beam diameter $d_T$. Accordingly, the amount by which 'S' can be increased is limited.

SUMMARY OF THE INVENTION

The main advantage of this invention is to reduce the spherical aberration coefficient of an objective lens intended for use in a scanning electron microscope or electron probe X-ray microanalyzer.

Another advantage of this invention is to obtain a high resolution scanning image by improving the structural design of the pole piece forming an intrinsic part of said objective lens.

A still further advantage of this invention is to facilitate manual adjustment of the microscope or microanalyzer stigmator by reducing the objective lens astigmatism.

These advantages are achieved by providing a plurality of pole piece gaps instead of a single gap as in the case of a conventional scanning electron microscope or electron probe X-ray microanalyzer, the additional pole pieces required for forming said plurality of gaps satisfying the allowed optimum dimension necessary for increasing the half value width 'd' of the objective lens magnetic field without generating a plurality of clearly divided peaks.

The aforementioned and other objects, features and advantages of the invention will become more readily apparent by reading the following detailed description in conjunction with the attached drawings.

BRIEF DESCRIPTION OF THE DRAWINGS

FIG. 8 is a graph showing the relation between the half value width 'd' and the gap width 'l', and FIGS. 9, 10, 11, 12 and 13 are schematic drawings of the objective lens according to this invention and their corresponding axial magnetic field distributions.

DETAILED DESCRIPTION OF THE INVENTION

Figure 1:
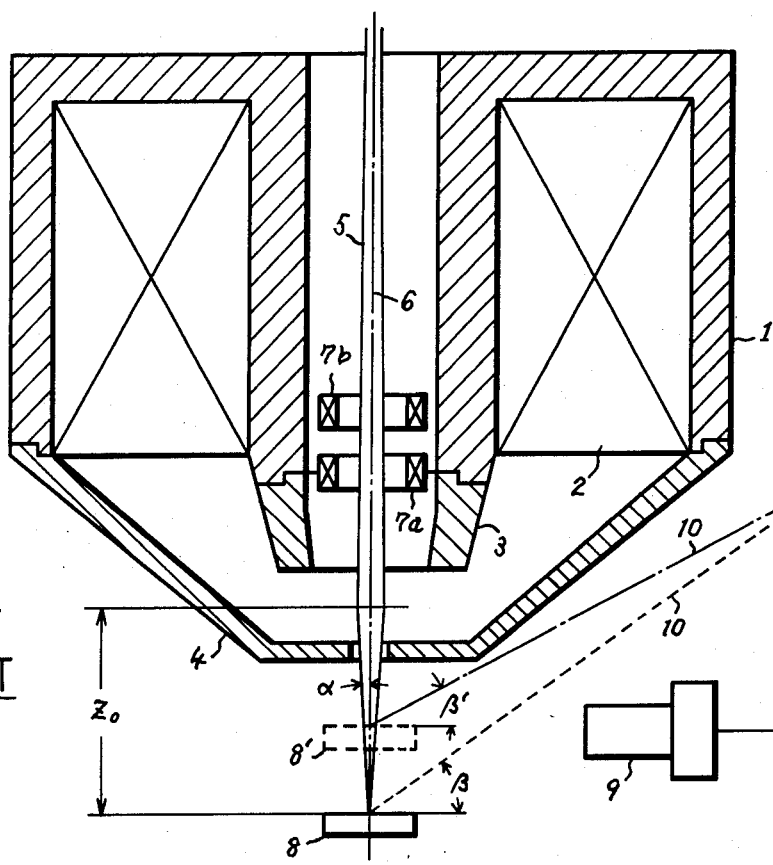
FIG. 1 is a schematic drawing showing an objective lens pole piece assembly widely used in conventional scanning electron microscopes.
Figure 6:
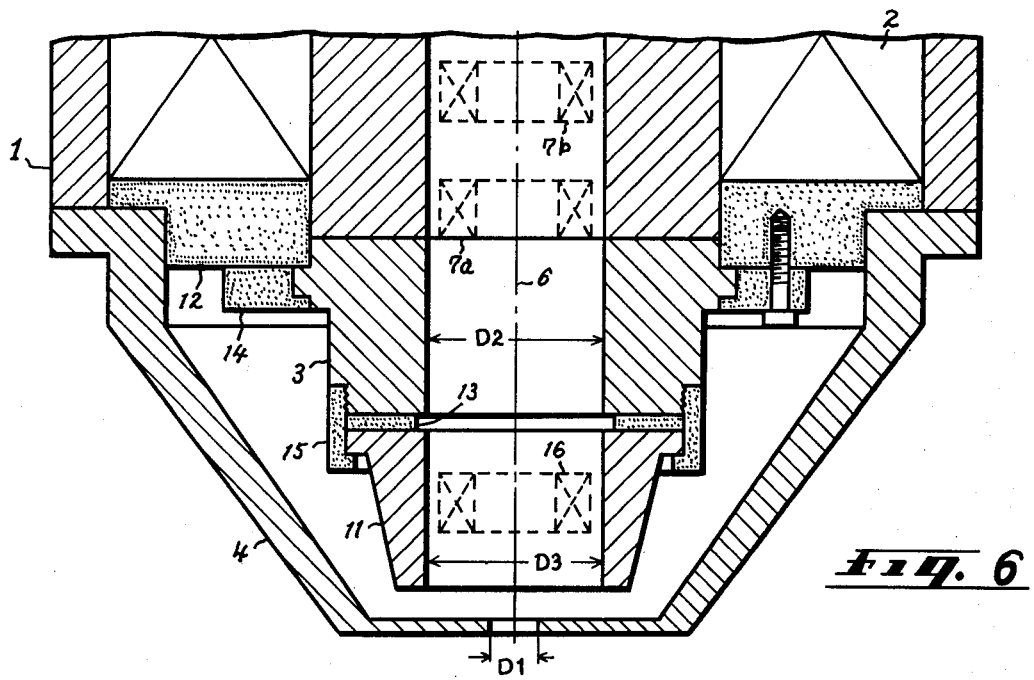
FIGS. 6 and 7 are schematic drawings of the objective lens according to this invention and its corresponding axial magnetic field distribution, respectively.

FIG. 6 shows one embodiment of an objective lens according to this invention in which the constituent parts having index numbers corresponding to those in FIG. 1 are identical in function if not in structure. In this embodiment, a supplemental magnetic pole piece 11 is incorporated between the upper and lower pole pieces 3 and 4, so that two pole piece gaps are formed in order to generate an objective lens magnetic field. The pole pieces are connected to the yoke 1 via nonmagnetic spacers 12, 13 and nonmagnetic connecting members 14, 15. A stigmator coil 16 is housed inside the supplemental pole piece 11. Since this coil is energized by static current, disturbance etc., due to interference between the objective lens field and field generated by the stigmator coil 16 does not occur. The inner diameter $D_3$ of the supplemental pole piece 11 is approximately equal to the inner diameter $D_2$ of the upper pole piece 3, and is twice as large as the inner diameter $D_1$ of the lower pole piece 4. Accordingly, the following equation is satisfied:

$$2 < D_3/D_1 \approx D_2/D_1 \qquad (3)$$

Thus, by making $D_1$ small, the objective lens field is prevented from extending towards the specimen.

Figure 7:
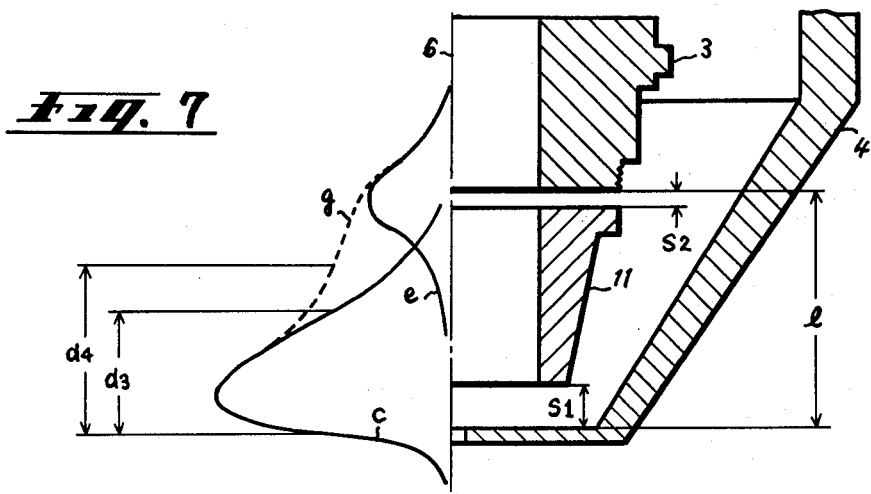

FIG. 7 shows the magnetic field distribution along the axis 6 in the case of the embodiment shown in FIG. 6. In the figure, curve 'c' represents the distribution of the magnetic field generated in gap $S_1$, curve 'e' represents the distribution of the magnetic field generated in gap $S_2$, and curve 'g' shows the sum magnetic field distribution of curves 'c' and 'e'. Thus, since the half value width $d_4$ of the curve 'g' is larger than the half value width $d_3$ of the curve 'c', it is possible to obtain a large half value width by selecting the size of $S_1$ and $S_2$, and the distance l between the upper and lower pole pieces 3 and 4, appropriately.

Figure 5:
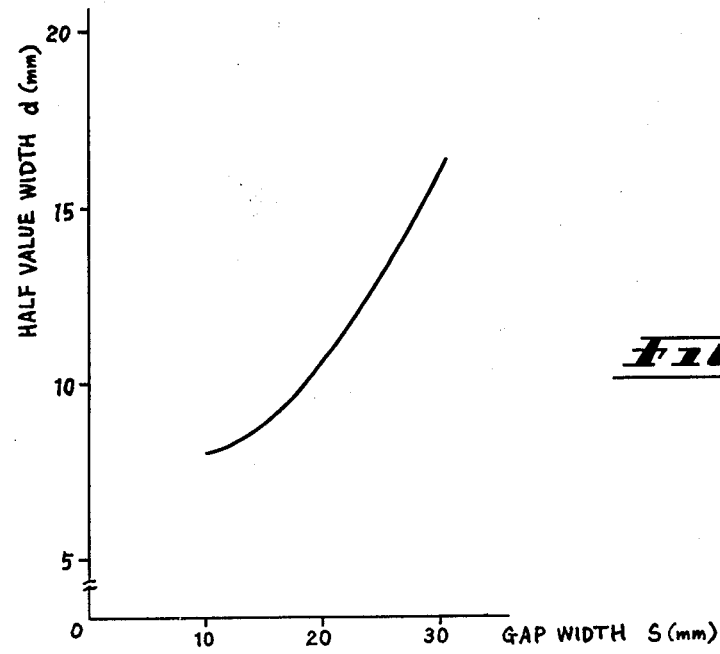
FIG. 5 is a graph showing the relation between the half value width 'd' and the gap width S.

FIG. 8 shows the experimental results, in which the relation between the distance l and half value width 'd' is measured at various values of $S_2/S_1$ under the condition of $D_1 = 10$ mm and $D_2 = 30$ mm. In order to compare the conventional single gap objective lens magnetic field with the double gap objective lens magnetic field (present invention), a broken curve 'L', corresponding to the curve in FIG. 5, is shown in FIG. 8 the locus being plotted on the assumption that the gap width S (mm) in FIG. 5 corresponds to the distance l (mm) in FIG. 8. By comparing the curves in FIG. 8, it is apparent that, under the conditions given in equations (4) and (5) below and assuming l > 15 mm, the half value width corresponding to the double gap lens is larger than the half value width corresponding to the conventional single gap lens:

$$l/D_2 > 0.5 \qquad (4)$$

$$S_2/S_1 > 0.4 \qquad (5)$$

However, if $S_2/S_1$ exceeds 1.5, for example the half width values corresponding to given values of l (=20 mm) in the case of $S_2/S_1 = 2$ curves will be less than those in the case of $S_2/S_1 = 1.5$ curves. Accordingly, the following equation must be satisfied.

$$S_2/S_1 < 1.5 \qquad (6)$$

Figure 2:
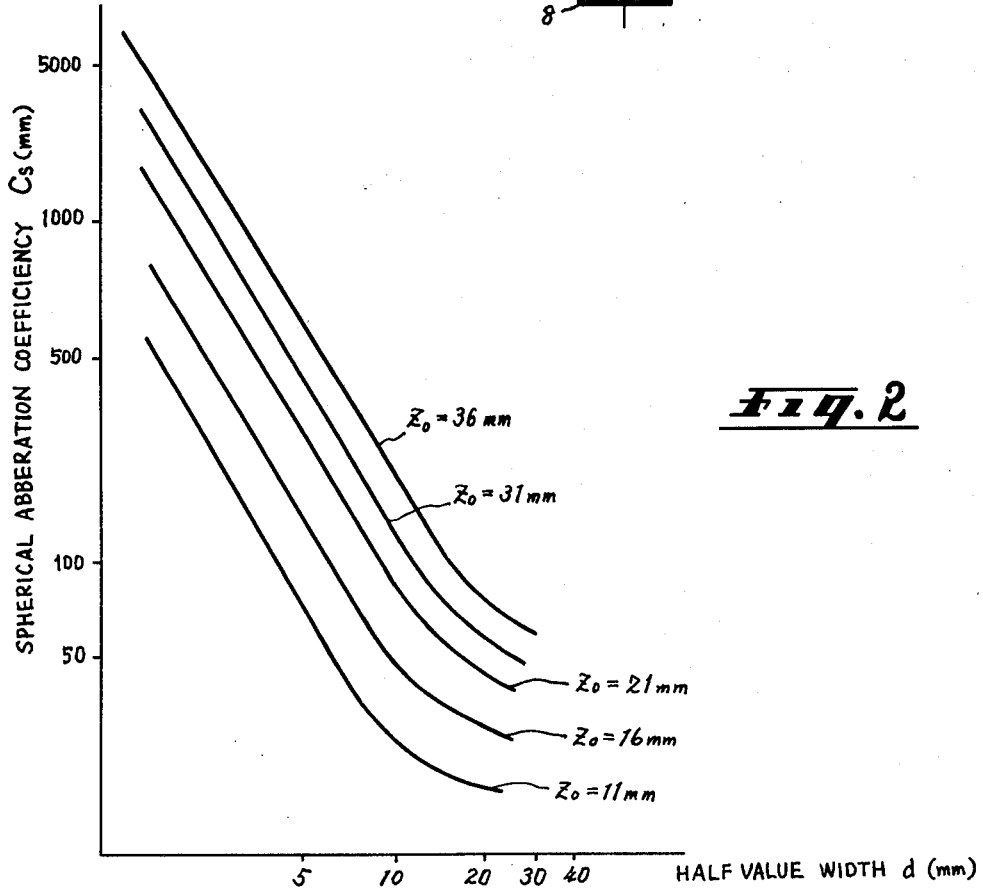
FIG. 2 is a graph showing the relation between the spherical aberration coefficient and the half value width of the axial magnetic field distribution of the single gap lenses.
Figure 3:
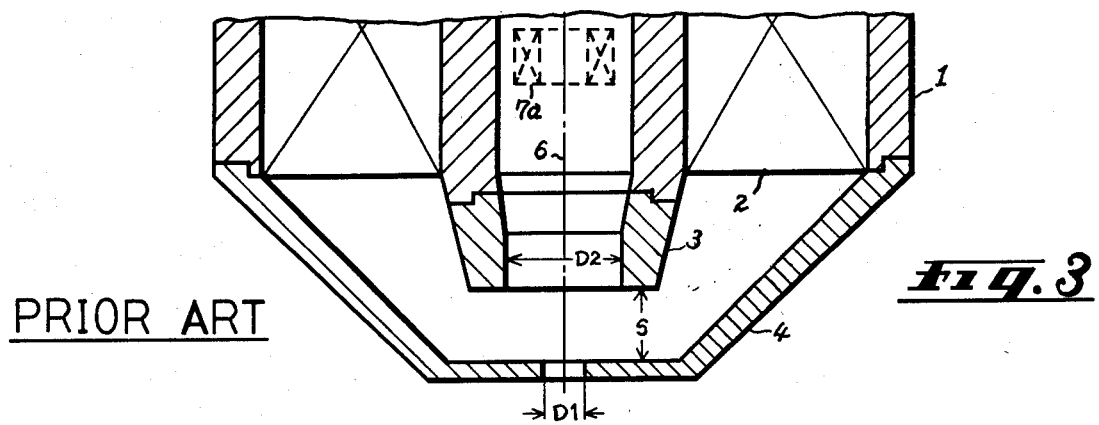
FIGS. 3 and 4 are schematic drawings of a conventional objective lens and its corresponding axial magnetic field distribution, respectively.
Figure 4:
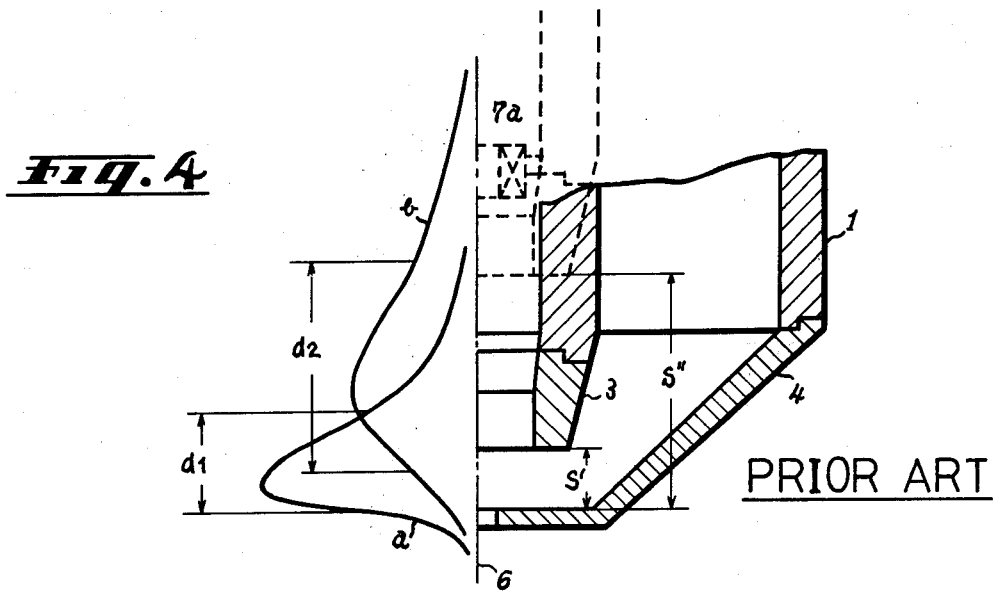
Figure 9:
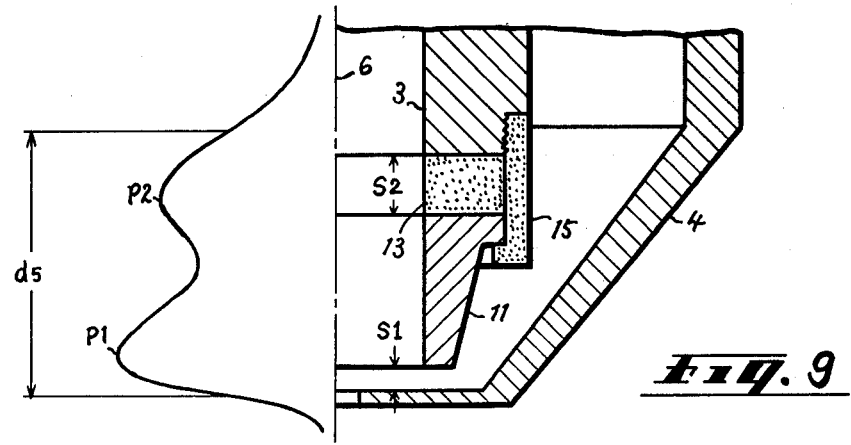

Moreover, if $S_2$ is made larger, i.e., $S_2/S_1 > 1.5$, the axial magnetic distribution will extend upwards as far as upper magnetic pole piece 3 and thereby produce undesirable interference between the objective lens field and deflecting field generated by the deflecting coil 7a. In addition to which, two clearly separated peaks $P_1$ and $P_2$ will appear in the objective lens magnetic field distribution curve as shown in FIG. 9. If this occurs, the spherical aberration coefficient Cs increases as the half value width 'd' increases, because the relation shown in FIG. 2 is not satisfied. Further, under the condition as shown in FIG. 9, the principal plane of the objective lens shifts upwards, with the result that the focal length of the objective lens becomes large and the chromatic aberration (corresponding to $d_c^2$ in equation (1)) increases.

For the above reasons and in due consideration of the experimental data compiled by the inventors, it was found that the best results were obtained when $0.5 < S_2/S_1 < 0.7$. Under the conditions satisfying this equation, a large half value width is assured without unduly shifting the principal plane towards the upper pole piece. Thus, it is possible to reduce the spherical aberration coefficient Cs without increasing $Z_o$ and the chromatic aberration coefficient Cc.

It is also known from the compiled experimental data that astigmatism, due to inaccurate pole piece machining, etc., decreases as the spherical aberration coefficient decreases, a phenomenon which makes precise stigmator adjustment much easier than in the case of the prior art.

FIG. 10 shows a modified version of the embodiment described in FIG. 6. In this case, the inner diameter $D_{31}$, near the upper pole piece, of the supplemental magnetic pole piece 17 is larger than the inner diameter $D_3$, near the lower pole piece, of the supplemental pole piece 17. In the figure, the objective lens magnetic field distribution on the axis of the half value width thereof are shown by curve 'i' and '$d_G$', respectively. On the other hand, the magnetic field distribution, in the case that the supplemental magnetic pole piece has the same inner diameter $D_3$, and the half value width thereof, are shown by the broken curve 'h' and $d_7$, respectively. By comparing curves 'i' and 'h', it is apparent that this modified version of the embodiment is better than the arrangement shown in FIG. 6. The supplemental pole piece 18 shown in FIG. 11 which has a partially tapered inner diameter can also be effectively used in the FIG. 10 arrangement in lieu of the supplemental pole piece 17.

Figure 12:
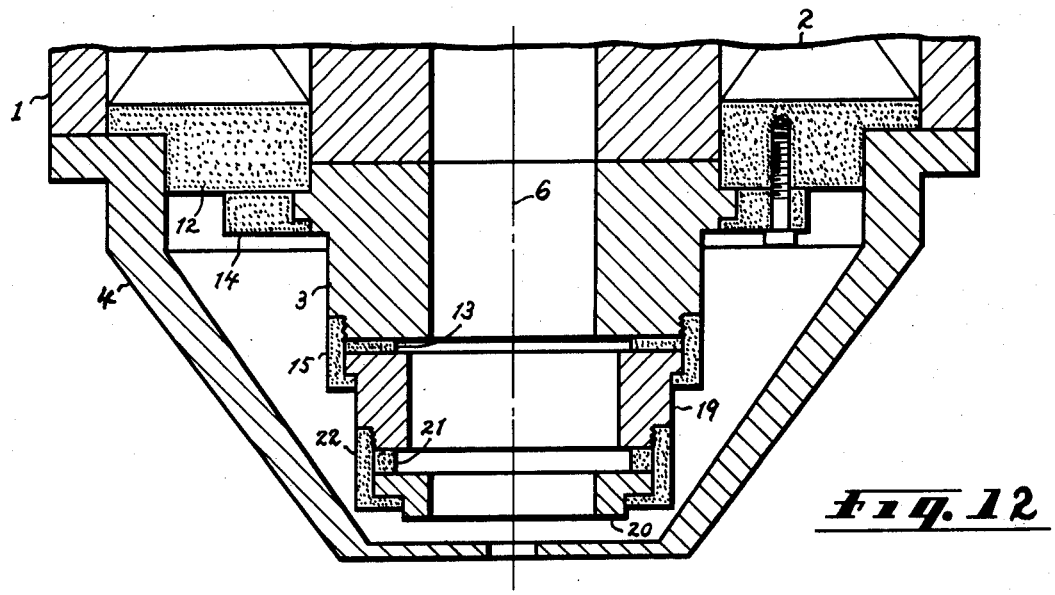
Figure 13:
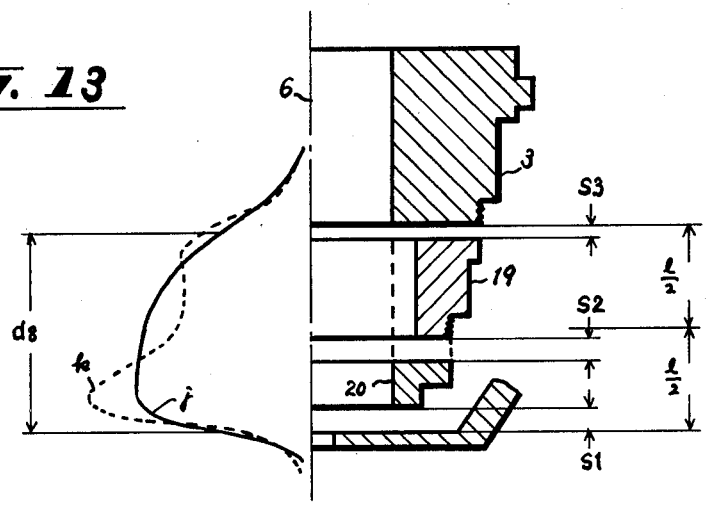

FIG. 12 shows a further variation of the FIG. 6 arrangement. In this case, two supplemental magnetic pole pieces 19 and 20 are arranged between the upper pole piece 3 and the lower pole piece 4, said pole pieces being fixed to the upper pole piece 3 by spacers 13 and 21, and connecting members 15 and 22. FIG. 13 shows the objective lens magnetic field distribution on the axis in the case of the FIG. 12 arrangement. In the figure, the large half value width $d_8$ of the distribution curve 'j' is obtained by selecting an appropriate value of 'l'. Incidentally, the broken curve 'k' shows the field distribution when the gap between the two supplemental pole pieces 19 and 20 is filled with a ferromagnetic material by incorporating a single supplemental pole piece having a uniform inner diameter $D_3$. In order to avoid generating a plurality of distribution peaks and to prevent the principal plane of the objective lens from shifting away from the lower pole piece 4, the following equations must be satisfied.

$$0.5 < S_2/S_1 < 1.0 \tag{7}$$

$$0.2 < S_3/S_1 < 0.75 \tag{8}$$

Generally, in an embodiment having a plurality of gaps, especially more than four gaps, it is required to satisfy the following equation (9), corresponding to equation (6).

$$G_2/G_1 < 1.5 \tag{9}$$

where, $G_1$ is the total width of the gaps in the lower half of the area between the upper and lower magnetic pole pieces, and $G_2$ is the total width of the gaps in the upper half of the area between the upper and lower magnetic half pole pieces. In the arrangement according to FIG. 13, $G_1 = S_1 + S_2$ and $G_2 = S_3$.

Having thus defined our invention in the detail and with the particularity required by the Patent Laws, what is desired protected by Letters Patent is set forth in the following claims.

We claim:

1. A magnetic electron objective lens for use in a scanning electron device, said lens being equipped with upper and lower magnetic pole pieces each having holes through which the electron beam passes, the hole diameter $D_2$ of the upper magnetic pole piece being larger than the hole diameter $D_1$ of the lower pole piece, said lens also being characterized in that at least one ring-shaped supplemental magnetic pole piece is installed between the upper and lower magnetic pole pieces so that the total width $G_1$ of the gaps between pole pieces in the lower half of the space between the upper and lower magnetic pole pieces is more than 1/1.5 times larger than the total width $G_2$ of the gaps between pole pieces in the upper half of the space between the upper and lower pole pieces, wherein the spherical abberration coefficient of the lens is reduced.

2. A magnetic electron lens as claimed in claim 1, incorporating a single supplemental magnetic pole piece, said lens being characterized in that if the terms $S_1$, $S_2$, and l are defined as follows, $S_1$ the distance between the lower and supplemental magnetic pole pieces, $S_2$ the distance between the supplemental and upper magnetic pole pieces, l the distance between the upper and lower magnetic pole pieces; and the distance l approximates $D_2$, and the following equation is satisfied:

$$0.4 < S_2/S_1 < 1.5.$$

3. A magnetic electron lens as claimed in claim 2, incorporating a single supplemental magnetic pole piece whose lower hole diameter is smaller than its upper hole diameter.

4. A magnetic electron lens as claimed in claim 1, incorporating two supplemental magnetic pole pieces, said lens being characterized in that if the terms $S_1$, $S_2$ and $S_3$ are defined as follows, $S_1$ the distance between the lower and first supplemental magnetic pole pieces, $S_2$ the distance between the first and second supplemental magnetic pole pieces, $S_3$ the distance between the second supplemental and upper magnetic pole pieces,
the following equations are satisfied:

$$0.5 < S_2/S_1 < 1, \text{ and}$$

$$0.2 < S_3/S_1 < 0.75.$$

5. A magnetic electron lens as claimed in claim 1, in which the minimum hole diameter of said supplemental pole piece near the upper pole piece is larger than that of the upper pole piece.

* * * * *